(12) United States Patent
Aoyagi et al.

(10) Patent No.: US 6,335,696 B1
(45) Date of Patent: Jan. 1, 2002

(54) PARALLEL-SERIAL CONVERSION CIRCUIT

(75) Inventors: Keisuke Aoyagi, Tokyo; Atsushi Sakamoto, Nagasaki, both of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/666,886

(22) Filed: Sep. 20, 2000

(30) Foreign Application Priority Data

May 10, 2000 (JP) .................................................. 12-136978

(51) Int. Cl.[7] .................................................. H03M 9/00
(52) U.S. Cl. .................................................. 341/100; 341/101
(58) Field of Search .................................. 341/101, 100

(56) References Cited

U.S. PATENT DOCUMENTS 5,798,720 A * 8/1998 Yano .............................. 341/101
5,959,559 A * 9/1999 Weder .......................... 341/101

FOREIGN PATENT DOCUMENTS

JP        60-189330        9/1985

* cited by examiner

*Primary Examiner*—Brian Young
(74) *Attorney, Agent, or Firm*—Leydig, Voit, & Mayer, Ltd.

(57) ABSTRACT

A parallel-serial conversion circuit includes a frequency divider circuit which outputs a dichotomized signal of an input clock signal. A positive edge triggered flip-flop and a negative edge triggered flip-flop receive data and the dichotomized signal is input. A tap signal generator receives the clock signal and generates and outputs a series of tap signals by providing different delays to the clock signal. A selection signal generator receives the tap signals and generates a series of pulse signals having the width equivalent to 1 bit of serial data. An inverter circuit inverts the dichotomized signal. A 10-bit parallel-serial converter receives data from of the flip-flops, a signal of the inverter circuit, and the pulse signals. The 10-bit parallel-serial converter performs parallel to serial conversion based on the input data and signals and outputs the serial data.

6 Claims, 6 Drawing Sheets

PARALLEL-SERIAL CONVERSION CIRCUIT

FIELD OF THE INVENTION

The present invention relates to a parallel-serial conversion circuit. More specifically, this invention relates to a parallel-serial conversion circuit which insures accurate timing between data and clocks in parallel-serial data conversion.

BACKGROUND OF THE INVENTION

FIG. 7 is a block diagram of a conventional parallel-serial conversion circuit as disclosed, in Japanese Patent Laid-Open Publication No. SHO 60-189330. The parallel-serial conversion circuit 1000 comprises an oscillation circuit 1001 which outputs a clock signal, a frequency divider circuit 1002 which dichotomizes the clock signal. The parallel-serial conversion circuit 1000 further comprises parallel-serial converters 1003, 1004 each having two input terminals, AND circuits 1005, 1006, an inverter circuit 1007, and an OR circuit 1008.

The clock signal output by the oscillation circuit 1001 is dichotomized by the frequency divider circuit 1002. The dichotomized signal is input into the parallel-serial converter 1003. Parallel data A, C is also input into the parallel-serial converter 1003. Serial data is output from the parallel-serial converter 1003.

The dichotomized signal inverted by the inverter circuit 1007 is input into the parallel-serial conversion circuit 1004. Parallel data B and D are also input into the serial-parallel converter 1004. Serial data is output from the serial-parallel converter 1004.

The AND circuits 1005, 1006 calculate the conjugate of the serial data output by the parallel-serial converters 1003, 1004. Serial data is output from the parallel-serial conversion circuit 1000 via the OR circuit 1008.

Consider a case, for instance, in which a parallel signal sent in synchronism with a 125 MHz clock is converted into a serial signal at a ratio of 10 to 1 using only the positive edge of the clock which is input into each of the parallel-serial converters 1003, 1004. Then, in the conventional high speed parallel-serial conversion circuit a high speed clock of 125 MHz ×10 =1.25 GHz is required as a clock to be input into the parallel-serial converters 1003, 1004.

Further, even if both the positive and negative edges of the clock are used, a high speed clock of 125 MHz×10/2=625 MHz is required.

Use of the high speed clock as described above presents a technological restriction in designing, which is a bottleneck in realization of high speed operations in parallel-serial conversion. Further, even when a high speed clock is not used, the data width is equal to the total width of signals used for selection of data, which requires strict adjustment of timing between data and clocks.

SUMMARY OF THE INVENTION

The parallel-serial conversion circuit according to this invention comprises a frequency divider circuit which outputs a dichotomized signal of an input clock signal. A positive edge triggered flip-flop and a negative edge triggered flip-flop receive data and the dichotomized signal are input. A tap signal generator receives the clock signal and generates and outputs a series of tap signals by providing different delays to the clock signal. A selection signal generator receives the tap signals generates a series of pulse signals having the width equivalent to 1 bit of serial data. An inverter circuit inverts the dichotomized signal. A 10-bit parallel-serial converter receives data of the flip-flops, signals of the inverter circuit, and the pulse signals. The 10-bit parallel-serial converter performs parallel to serial conversion based on the input data and signals and outputs the serial data.

Other objects and features of this invention will become apparent from the following description with reference to the accompanying drawings.

DESCRIPTION OF THE PREFERRED EMBODIMENTS

Figure 1:
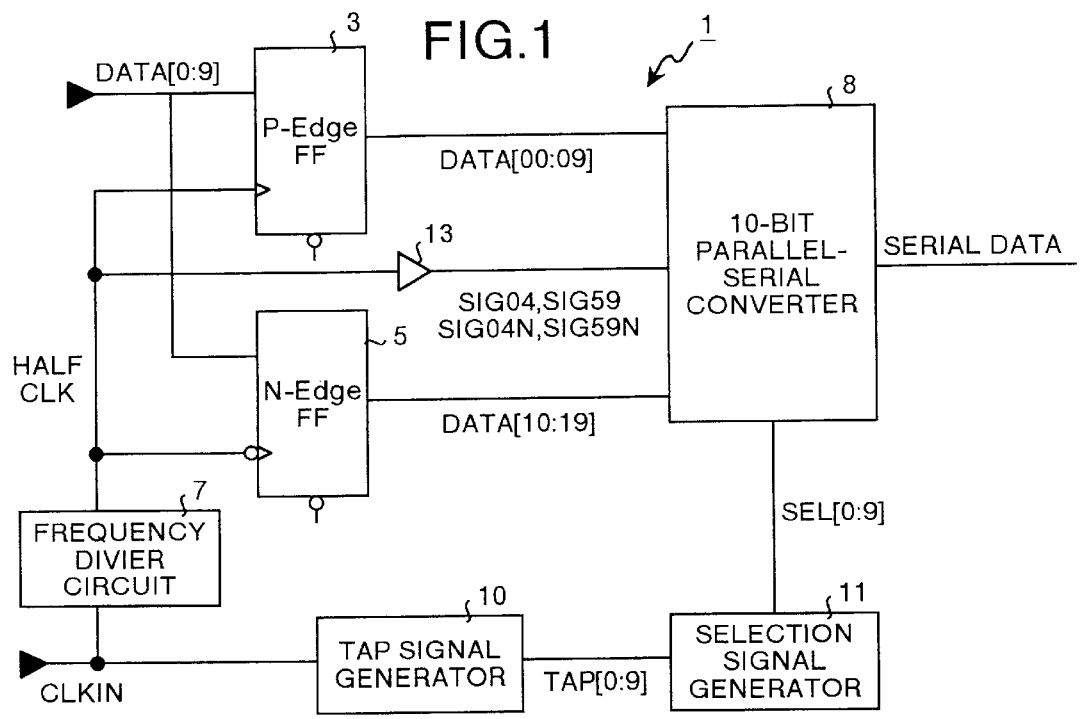
FIG. 1 is a block diagram showing a parallel-serial conversion circuit according to a first embodiment of the present invention.

The present invention is described in detail below. FIG. 1 is a block diagram showing a parallel-serial conversion circuit according to a first embodiment of the present invention. The parallel-serial conversion circuit 1 comprises a frequency divider circuit 7 into which a clock signal CLKIN (described as CLKIN hereinafter) is input, a positive edge triggered flip-flop (described as P-Edge FF hereinafter) 3 into which a dichotomized signal HALFCLK output by the frequency divider circuit 7 and data [0:9] are input, and a negative edge triggered flip-flop (described as N-Edge FF hereinafter) 5.

The parallel-serial conversion circuit 1 further comprises a tap signal generator 10 (comprising, for instance, a DLL (Delay Locked Loop)) into which a clock signal CLKIN is input, a selection signal generator 11 (comprising, for instance, a RS-latch) into which a group of taps [0:9] output from the tap signal generator 10 and having different delays (described as tap signal TAP [0:9] hereinafter) are input, and an inverter circuit 13 into which the dichotomized clock signal HALFCLK output by the frequency divider circuit 7 is input.

The parallel-serial conversion circuit 1 further comprises a 10-bit parallel-serial converter 8 into which data [0:9] output by the P-Edge FF 3, inverted clock signals SIG04, SIG59, SIG04N, and SIG59N each output by the inverter circuit 13, data [10:19] output by the N-Edge FF 5, and a pulse signal SEL [0:9] output by the selection signal generator 11 and having the width equivalent to 1 bit of serial data (described as selection signal SEL [0:9] hereinafter) are input. The 10-bit parallel-serial converter 8 outputs a serial data.

Figure 2:
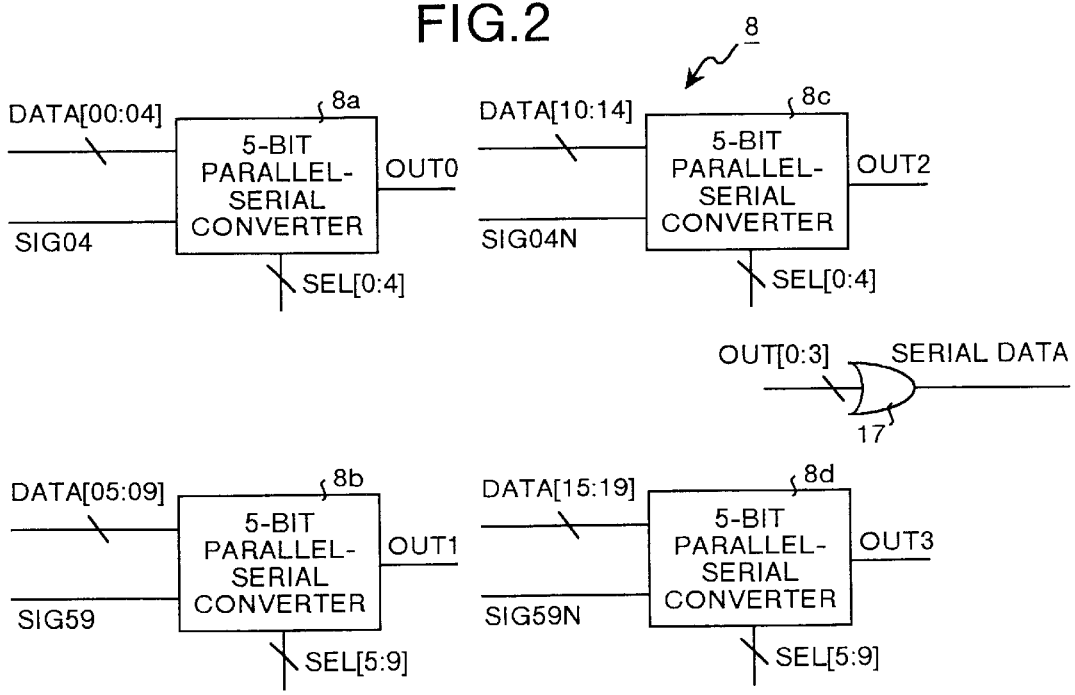
FIG. 2 is a block diagram showing a 10-bit parallel-serial converter according to the first embodiment of the present invention.

FIG. 2 is a block diagram showing a detail structure of the 10-bit parallel-serial converter according to the first embodiment of the present invention. The 10-bit parallel-serial converter 8 comprises four 5-bit parallel-serial converters 8a to 8d and a OR circuit 17.

Figure 3:
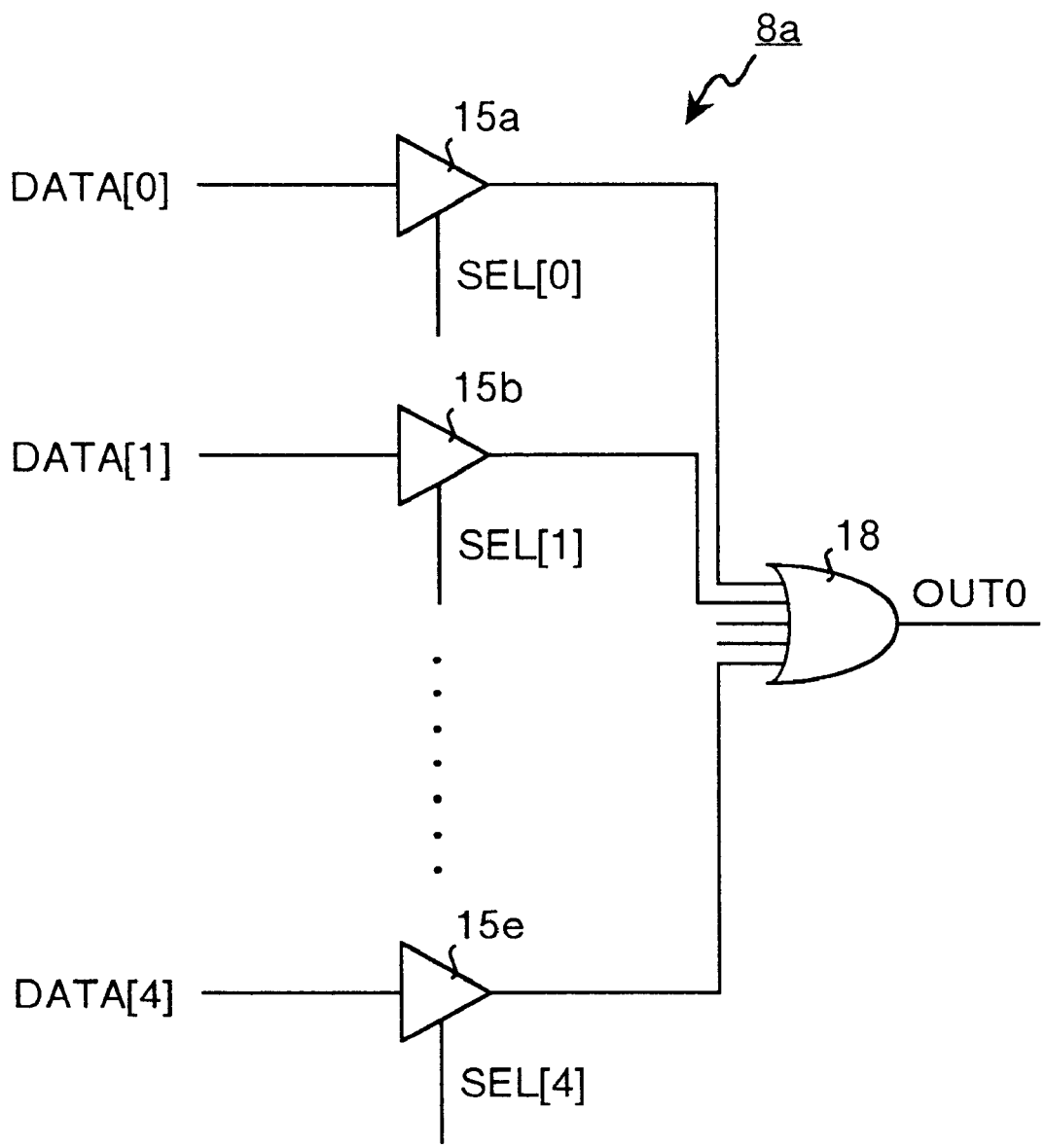
FIG. 3 is a circuit diagram showing a 5-bit parallel-serial according to the first embodiment.

FIG. 3 is a circuit diagram showing a detail structure of the 5-bit parallel-serial converter according to the first embodiment. The 5-bit parallel-serial converter 8a comprises five selector circuits 15a to 15e, and a OR circuit 18.

Operations of the 5-bit parallel-serial converter 8a will be explained here. Data [00:09] output by the P-Edge FF 3, data [10:19] output by the N-Edge FF 5, and a pulse signal SEL [0:9] having the width equivalent to 1 bit of serial data are input into each of the selector circuits 15a to 15e. Output of each of the selector circuits 15a to 15e is input into the OR circuit 18. Serial data is output from the OR circuit 18.

Figure 4:
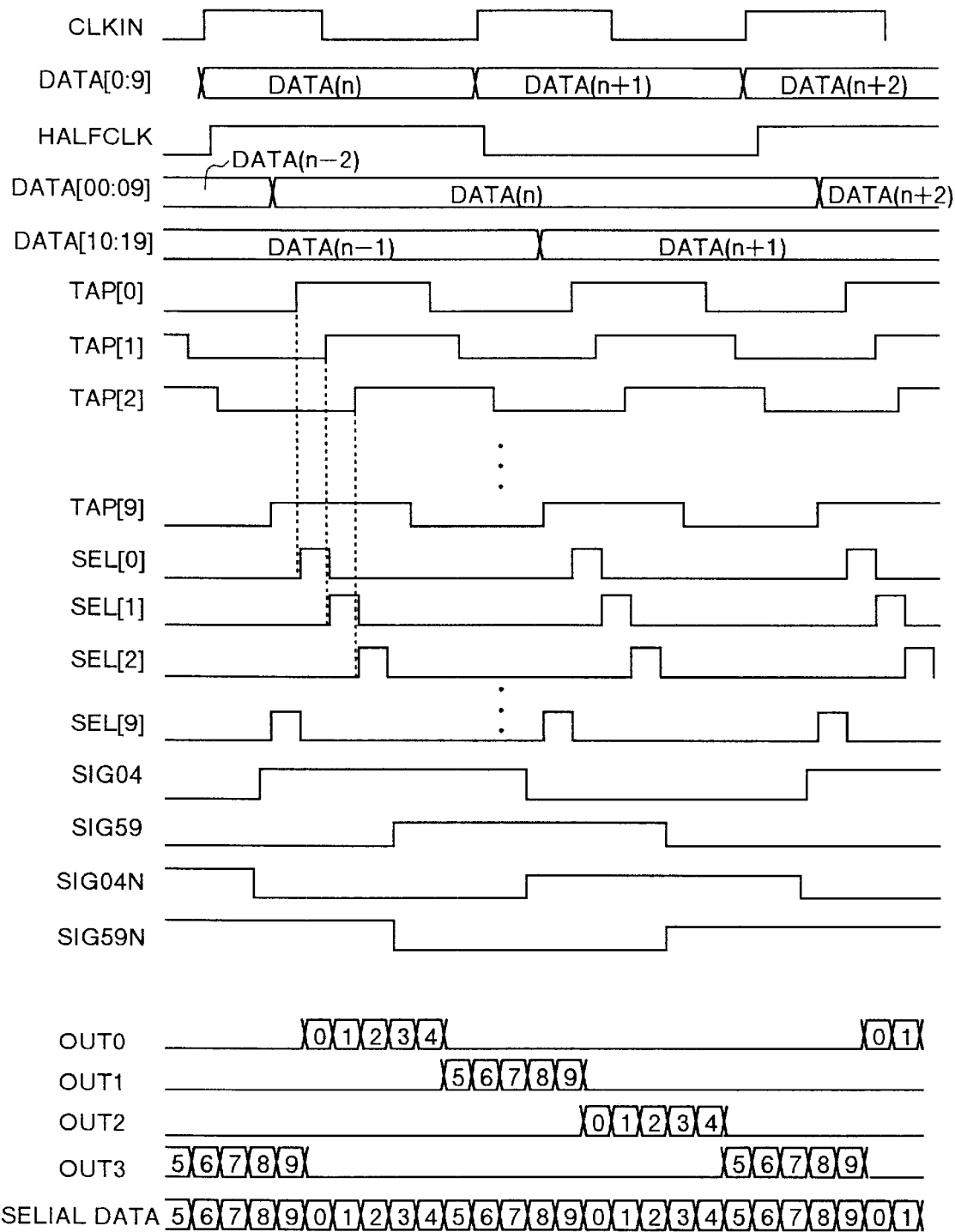
FIG. 4 is a timing chart of the parallel-serial conversion circuit according to the first embodiment of the present invention.

FIG. 4 is a timing chart of the parallel-serial conversion circuit according to the first embodiment of the present invention. Operations of the parallel-serial conversion circuit 1 will be explained here with reference to FIG. 1 to FIG. 4.

The parallel-serial conversion circuit 1 alternately sends data having a cycle two times larger than that of input data (outputs data [00:09], [10:19] to two data lines with the P-Edge FF 3, N-Edge FF 5, and frequency divider circuit 7 which outputs a dichotomized signal HALFCLK inverting at each positive edge of a clock signal CLKIN.

The selection signal generator 11 generates pulse signals SEL [0:9] from the corresponding tap signal TAP [0:9] received from the tap signal generator 10.

The selector circuits 15a to 15e output a value of data [0:9] as it is only when "H" is given to the pulse signal SEL [0:9], and otherwise output "L".

The pulse signal SEL [0:9] is simultaneously sent to two of the two 5-bit parallel-serial converters (for instance, 8b, 8d), but the parallel-serial conversion circuit 1 decides which of the four units of 5-bit parallel-serial converters 8a to 8d are to be selected with four signals (SIG4, SIG59, SIG4N, SIG59N) having the same frequency as the HALF-CLK but with phases a little displaced from each other, and serially outputs the data.

The signal SIG04 is generated by delaying a clock signal HALFCLK. Further, the signal SIG59 is generated by inverting a dichotomized clock signal at each negative edge like in generation of a dichotomized clock signal HALFCLK of a clock signal CLKIN. Further, the signals SIG04N and SIG59N are generated by inverting the signals SIG04 and SIG59 respectively.

The parallel-serial conversion circuit 1 finally outputs data output by the four 5-bit parallel-serial converters 8a to 8d (OUT [0:3]) as serial data via the OR circuit 17.

According to the parallel-serial conversion circuit of the first embodiment of the present invention, a clock which is ⅒ or ⅕ of that required conventionally can be used. Further, since the clock is reduced, it is possible to provide time allowance in timing between data and clock. Accordingly, data conversion can be performed accurately and without fail.

Figure 5:
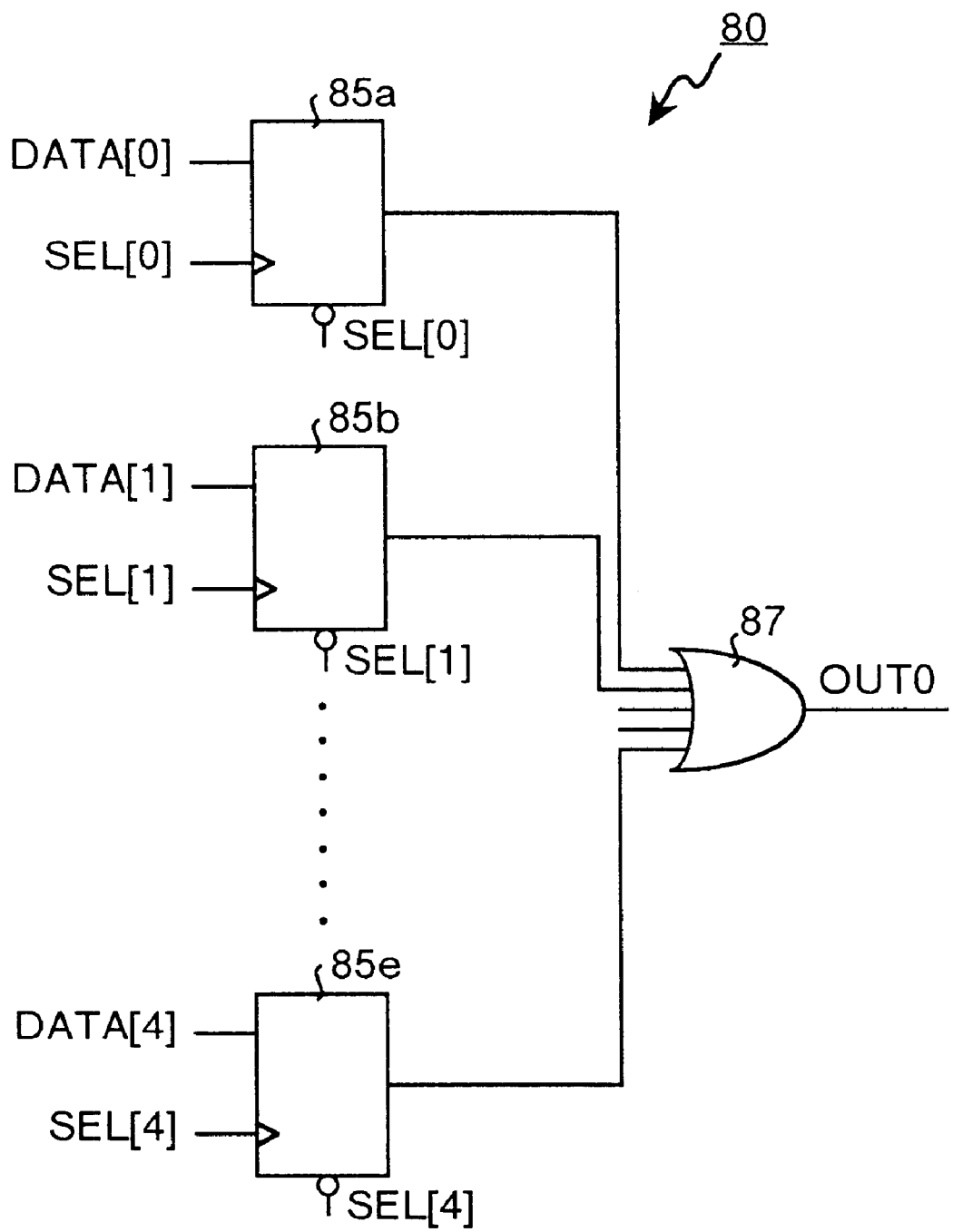
FIG. 5 is a circuit diagram showing 5-bit parallel-serial conversion circuit according to a second embodiment of the present invention.

FIG. 5 is a circuit diagram showing a 5-bit parallel-serial converter according to a second embodiment of the present invention. The 5-bit parallel-serial converter 80 comprises five units of P-Edge FF 85a to 85e and OR circuit 87.

For instance, a pulse signal SEL [0] is input corresponding to the data of zero-th bit as a reset signal. Pulse signal SEL [0] or the tap signal TAP [0] may be used as the clock signal. Since the P-Edge FF 85a operates only when the pulse signal SEL [0] is at high level, it is necessary to delay a signal used as a clock as compared to the pulse signal SEL [0] used as a reset signal Further, since the P-Edge FF 85a operates only when the pulse signal SEL [0] is high level, positive edge of the pulse signal SEL [0] is detected, and a value of data [0] is outputted as it is. While the pulse signal SEL [0] is at low level, a low level signal is output. Remaining operations are the same as in the first embodiment.

In the parallel-serial conversion circuit according to the second embodiment a 5-bit parallel-serial converter which detects a positive edge of a pulse signal SEL [0] and outputs a value of data [0] as it is provided. Accordingly, further allowance is given to timing between data and clocks, and accurate data conversion can be performed.

Figure 6:
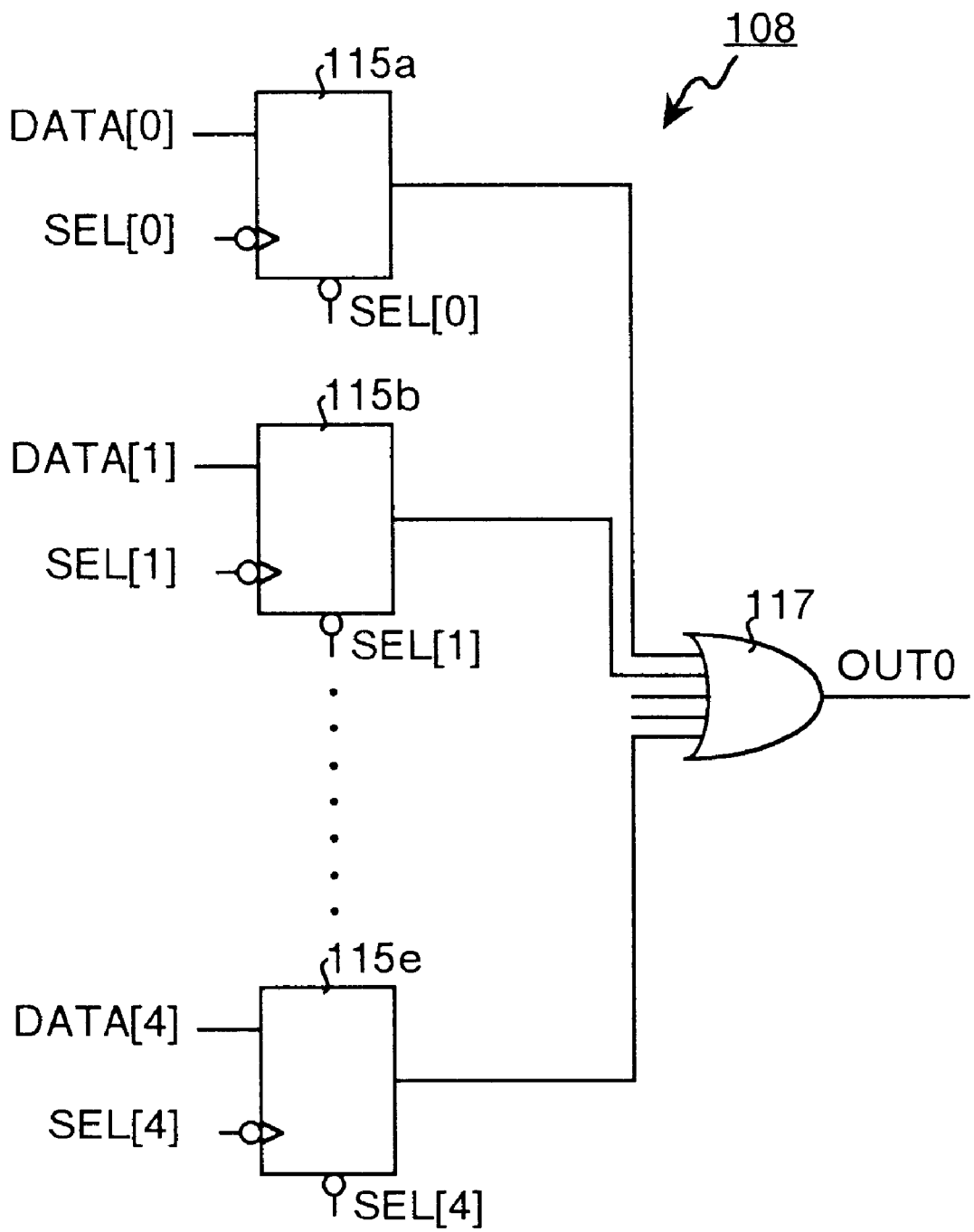
FIG. 6 is a circuit diagram showing a 5-bit parallel-serial converter according to a third embodiment of the present invention.
Figure 7:
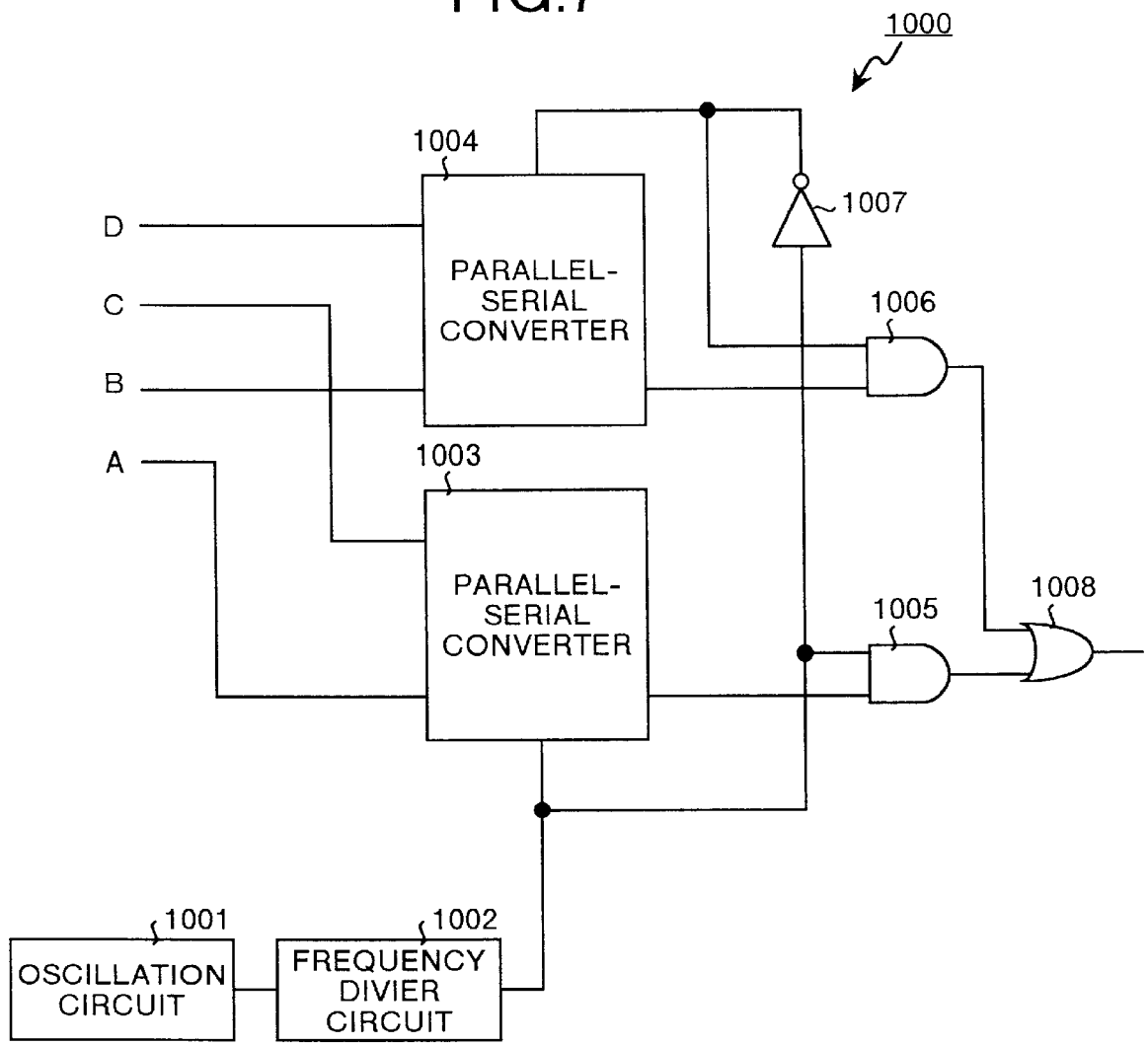
FIG. 7 is a block diagram showing a conventional parallel-serial conversion circuit.

FIG. 6 is a circuit diagram showing a 5-bit parallel-serial converter according to a third embodiment of the present invention. The 5-bit parallel-serial converter 108 comprises five units of N-Edge FF 115a to 115e and OR circuit 117.

For instance, a pulse signal SEL [0] is input as a reset signal corresponding to the data of zero-th bit. Pulse signal SEL [0] or the inverted tap signal TAP [0] may be used as a clock signal. When the pulse signal SEL [0] is used as a clock signal, it is necessary to advance the signal used as a clock a little as compared to that used as a reset signal, because the N-Edge FF 115a operates only while the pulse signal SEL [0] is at high level.

When the inverted tap signal TAP [0] is used as the clock signal, it is necessary to delay the negative edge as compared to a positive edge of the pulse signal SEL [0] used as a reset signal.

While the pulse signal SEL [0] is at high level, a negative edge of the pulse signal SEL [0] is detected, and a value of data [0] is output as it is. While the pulse signal SEL [0] is at low level, a low level signal is output. Remaining operations are the same as in the first embodiment.

In the parallel-serial con version circuit according to the third embodiment a 5-bit parallel-serial converter which detects a negative edge of the pulse signal SEL [0] and outputs a value of data [0] as it is provided. Accordingly, further allowance is given to timing between data and clocks, and accurate data conversion can be performed.

The parallel-serial conversion circuit according to the present invention comprises a frequency divider circuit into which a clock signal is input; a positive edge triggered flip-flop; a negative edge triggered flip-flop into which a dichotomized signal output by the frequency divider circuit and data are input; a tap signal generator into which a clock signal is input; a selection signal generator into which a clock signal output by the tap signal generator and having a delay difference is input; an inverter circuit into which the dichotomized signal is input; and a 10-bit parallel-serial converter into which data output by the positive edge triggered flip-flop, a signal output by the inverter circuit, data output by the negative edge triggered flip-flop, and a pulse signal output by the selection signal generator and having the width equivalent to 1 bit of serial data are input and also which outputs the serial data. Thus, a clock which is ⅒ or ⅕ of that required conventionally can be used. Further, since the clock is reduced,. it is possible to provide time allowance in timing between data and clock. Accordingly, data conversion can be performed accurately and without fail.

Further, the 10-bit parallel-serial converter comprises four units of 5-bit parallel-serial converters and an OR circuit into which data output by each of the 5-bit parallel-serial converters is input. Accordingly, it is possible to give allowance to timing between data and clocks.

Further, the 5-bit parallel-serial converter comprises five selector circuits into which data output by the positive edge triggered flip-flop or data output by the negative edge triggered flip-flop, and a pulse signal having the width equivalent to 1 bit of serial data are input; and an OR circuit into which output from each of the selector circuits is input. Accordingly, accurate data conversion can be performed.

Further, the selector circuit has a 5-bit parallel-serial converter comprising a positive edge triggered flip-flop. Accordingly, data conversion can be performed more accurately.

Further, the selector circuit has a 5-bit parallel-serial converter comprising a negative edge triggered flip-flop. Accordingly, data conversion can be performed more accurately.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A parallel-serial conversion circuit comprising:
   a frequency divider circuit into which a clock signal is input;
   a positive edge triggered flip-flop and a negative edge triggered flip-flop into which data and a dichotomized signal output by said frequency divider circuit are input;
   a tap signal generator into which the clock signal is input;
   a selection signal generator into which a pulse signal generated by said tap signal generator by delaying is input;
   an inverter circuit into which the dichotomized signal output by said frequency divider circuit is input; and
   a 10-bit parallel-serial converter into which data output by said positive edge triggered flip-flop, a signal output by said inverter circuit, data output by said negative edge triggered flip-flop, and the pulse signal output by said selection signal generator and having a width equivalent to 1 bit of serial data are input and which outputs the serial data.

2. The parallel-serial conversion circuit according to claim 1, wherein said 10-bit parallel-serial converter comprises four 5-bit parallel-serial converters; and an OR circuit into which data output by each of said 5-bit parallel-serial converters is input.

3. The parallel-serial conversion circuit according to claim 2, wherein said 5-bit parallel-serial converter comprises five selector circuits into which data output by one of said positive edge triggered flip-flop and said negative edge triggered flip-flop, and the pulse signal having the width equivalent to 1 bit of serial data are input, and an OR circuit into which data output by each of said selector circuits is input.

4. The parallel-serial conversion circuit according to claim 3, wherein said selector circuit comprises a positive edge triggered flip-flop.

5. The parallel-serial conversion circuit according to claim 3, wherein said selector circuit comprises a negative edge triggered flip-flop.

6. A parallel-serial conversion circuit comprising:
   a frequency divider circuit into which a clock signal is input and which outputs a dichotomized signal of the clock signal;
   a positive edge triggered flip-flop and a negative edge triggered flip-flop into which data and the dichotomized signal output by said frequency divider circuit are input;
   a tap signal generator into which the clock signal is input and which generates and outputs a series of tap signals by providing different delays to the clock signal;
   a selection signal generator into which the tap signals generated by said tap signal generator are input and which generates a series of pulse signals corresponding to the tap signals and having a width equivalent to 1 bit of serial data;
   an inverter circuit into which the dichotomized signal output by said frequency divider circuit is input; and
   a 10-bit parallel-serial converter into which data output by said positive edge triggered flip-flop, a signal output by said inverter circuit, data output by said negative edge triggered flip-flop, and the pulse signals are input, and which performs parallel to serial conversion based on the data and signals input and outputs the serial data.

* * * * *